(12) United States Patent
Ryu (10) Patent No.: US 10,782,762 B2
(45) Date of Patent: Sep. 22, 2020

(54) ELECTRONIC DEVICE, APPARATUS AND METHOD FOR POWER SUPPLYING THEREFOR

(71) Applicant: SK hynix Inc., Gyeonggi-do (KR)

(72) Inventor: Seung Han Ryu, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 175 days.

(21) Appl. No.: 16/142,102

(22) Filed: Sep. 26, 2018

(65) Prior Publication Data

US 2019/0339761 A1  Nov. 7, 2019

(30) Foreign Application Priority Data

May 4, 2018  (KR) .................. 10-2018-0051947

(51) Int. Cl.
| G06F 1/30 | (2006.01) |
| H02J 7/34 | (2006.01) |
| G01R 19/165 | (2006.01) |
| G11C 16/30 | (2006.01) |
| G05F 1/10 | (2006.01) |
| G06F 1/28 | (2006.01) |
| G06F 1/26 | (2006.01) |

(52) U.S. Cl.
CPC .......... *G06F 1/30* (2013.01); *G01R 19/16552* (2013.01); *G05F 1/10* (2013.01); *G06F 1/28* (2013.01); *G11C 16/30* (2013.01); *H02J 7/345* (2013.01); *G06F 1/263* (2013.01)

(58) Field of Classification Search
CPC ... G06F 1/30; G06F 1/28; G06F 1/263; G01R 19/16552; G05F 1/10; G11C 16/30; H02J 7/345
See application file for complete search history.

(56) References Cited

U.S. PATENT DOCUMENTS 10,094,887 B2 * 10/2018 Lee ...................... H02J 9/00

FOREIGN PATENT DOCUMENTS

KR  101319155  10/2013

* cited by examiner

*Primary Examiner* — Robert L Deberadinis
(74) *Attorney, Agent, or Firm* — IP & T Group LLP (57) ABSTRACT

An electronic device may include a semiconductor memory device, a central processing device that controls an operation of the semiconductor memory device, and a power supply that supplies power to the semiconductor memory device and the central processing device, and the power supply may include a power controller that receives external power and generates an internal voltage and a charge voltage, an auxiliary power unit that is charged by the charge voltage in a normal mode and provides charged power when sudden power loss occurs, and a charge voltage conversion unit that supplies the auxiliary power unit with the charge voltage at a first level in the normal mode, and converts the first level of the charge voltage to a second level higher than the first level and supplies the charge voltage to the auxiliary power unit in a test mode.

14 Claims, 8 Drawing Sheets

ELECTRONIC DEVICE, APPARATUS AND METHOD FOR POWER SUPPLYING THEREFOR

CROSS-REFERENCE TO RELATED APPLICATION

The present application claims priority under 35 U.S.C. § 119(a) to Korean application number 10-2018-0051947, filed on May 4, 2018, in the Korean Intellectual Property Office, which is incorporated herein by reference in its entirety.

BACKGROUND

1. Technical Field

Various embodiments generally relate to an electronic device. Particularly, the embodiments relate to an electronic device, a power supply therefor, and a method for controlling the power supply.

2. Related Art

An electronic device may use a battery, which is rechargeable from a power supply source, or an external DC or AC power supply and the like.

In the power supply source, an unexpected interruption, for example, sudden interruption of power supply, that is, sudden power loss (SPL) or sudden power off (SPO), may occur due to various factors such as failure of the power supply source itself and an electrical disconnection between the electronic device and the power supply source.

When the SPL or SPO occurs, unrecoverable loss of data may occur in the electronic device. Particularly, when the electronic device includes an information storage medium, since user data may be lost or damaged due to the sudden interruption of power supply, reliability of the electronic device may not be guaranteed.

When the SPL or SPO occurs, a power loss protection (PLP) operation may be performed by detecting the SPL or SPO. For example, the PLP may be performed by changing the power supply source of the sudden power loss to an auxiliary power supply separately provided from the power supply source when the sudden power loss occurs.

After the supply of power from the power supply source is interrupted, since the electronic device depends only on the power of the auxiliary power supply, it is very important to ensure reliability of the auxiliary power supply.

SUMMARY

In an embodiment, an electronic device may include: a semiconductor memory device; a central processing device configured to control an operation of the semiconductor memory device; and a power supply configured to supply power to the semiconductor memory device and the central processing device, wherein the power supply may include: a power controller configured to receive external power and generate an internal voltage and a charging voltage; an auxiliary power supply configured to be charged by the charging voltage in a normal mode and to provide charged power when a sudden power loss (SPL) or a sudden power off (SPO) occurs; and a charging voltage converter configured to supply the auxiliary power supply with the charging voltage of a first level in the normal mode, and to increase the charging voltage to a second level that is higher than the first level and supply the charging voltage to the auxiliary power supply in a test mode.

In an embodiment, a power supply for an electronic device may include: a power controller configured to receive external power and generate an internal voltage and a charging voltage; an auxiliary power supply configured to be charged by the charging voltage in a normal mode and to provide charged power when a sudden power loss (SPL) or a sudden power off (SPO) occurs; and a charging voltage converter configured to supply the auxiliary power supply with the charging voltage of a first level in the normal mode, and to increase the charging voltage to a second level that is higher than the first level and supply the charging voltage to the auxiliary power supply in a test mode.

In an embodiment, a control method of a power supply for an electronic device, which includes an auxiliary power supply that receives external power, supplies the external power to the electronic device, is charged by a charging voltage in a normal mode, and provides charged power when a sudden power loss (SPL) or a sudden power off (SPO) occurs, the control method may include: supplying the charging voltage of a first level to the auxiliary power supply in the normal mode; and increasing the charging voltage to a second level that is higher than the first level and supplying the charging voltage to the auxiliary power supply in a test mode.

In and embodiment, an electronic device may include: a main power supply configured to supply main power to the electronic device; an auxiliary power supply configured to supply auxiliary power to the electronic device; and a control component configured to control the main power supply to supply the main power to the electronic device when the main power is available, and control the auxiliary power supply to supply the auxiliary power to the electronic device when the main power is not available, wherein the control component further charges the auxiliary power supply to have a first level in a normal mode while the main power is available, wherein the control component further charges the auxiliary power supply to have a second level in a test mode while the main power is available, wherein the second level is higher than the first level, and wherein power supply capacity of the auxiliary power supply is evaluated through discharge thereof in the test mode.

DETAILED DESCRIPTION

Various embodiments are described below in more detail with reference to the accompanying drawings. We note, however, that the present teaching may be embodied in different forms and variations, and should not be construed as being limited to the embodiments set forth herein. Rather, the described embodiments are provided so that this disclosure will be thorough and complete, and will fully convey the present teaching to those skilled in the art to which this teaching pertains. Throughout the disclosure, like reference numerals refer to like parts throughout the various figures and embodiments of the present teaching. It is noted that reference to "an embodiment" does not necessarily mean only one embodiment, and different references to "an embodiment" are not necessarily to the same embodiment(s).

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present teaching.

As used herein, singular forms may include the plural forms as well and vice versa, unless the context clearly indicates otherwise.

Hereinafter, an electronic device, a power supply therefor, and a method for controlling the power supply will be described below with reference to the accompanying drawings through various examples of embodiments.

Figure 1:
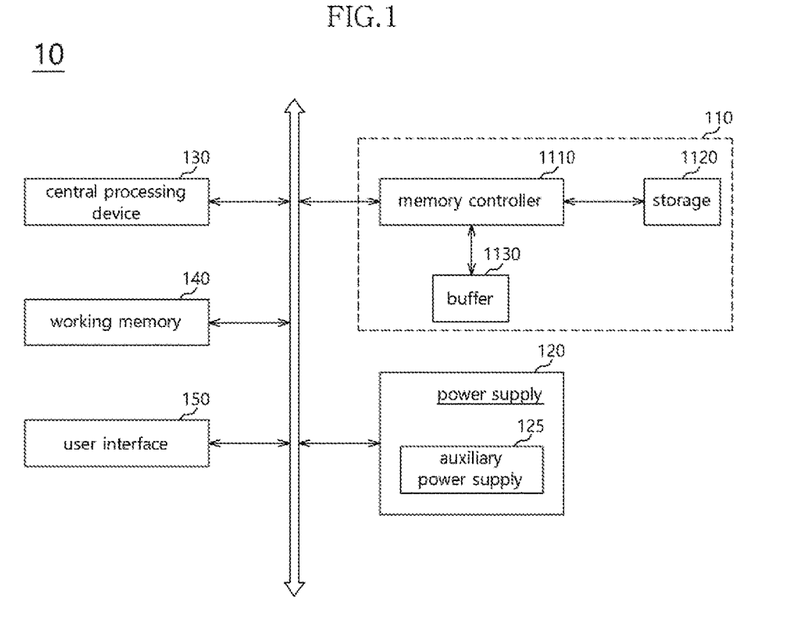
FIG. 1 is a configuration diagram of an electronic device in accordance with an embodiment.

FIG. 1 is a configuration diagram of an electronic device 10 in accordance with an embodiment.

Referring to FIG. 1, the electronic device 10 may include a semiconductor memory device 110, a power supply 120, a central processing device 130, a working memory 140, and a user interface 150.

The semiconductor memory device 110 may include a memory controller 1110, a storage 1120, and a buffer 1130.

The storage 1120 may serve as a data storage medium of the electronic device 10.

The storage 1120 may write data or output the written data under the control of the memory controller 1110. The storage 1120 may include a volatile or nonvolatile memory device. In an embodiment, the storage 1120 may be implemented using a memory element selected from various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-MRAM). The storage 1120 may include a plurality of dies, a plurality of chips, or a plurality of packages. In addition, the storage 1120 may include a single-level cell that stores one-bit data in one memory cell or a multi-level cell that stores multi-bit data in one memory cell.

The buffer 1130 may temporarily store data which is inputted to the storage 1120 or is outputted from the storage 1120.

The power supply 120 may provide the electronic device 10 with power inputted through a power connector. The power supply 120 may include an auxiliary power supply 125.

The power supply 120 may include various power supplies such as a DC power supply, an AC power supply, and a chargeable battery (not shown). The power supply 120 may also be called a main power supply to distinguish from the auxiliary power supply 125.

The auxiliary power supply 125 may supply power such that the electronic device 10 shuts down normally when the sudden power loss (SPL) occurs. The auxiliary power supply 125 may include large capacity capacitors; however, an embodiment is not limited thereto.

The central processing device 130 may analyze and process signals inputted to the electronic device 10 in order to control the operation of the semiconductor memory device 110. The central processing device 130 may control the operation of the electronic device 10 according to firmware or software for driving the electronic device 10.

The working memory 140 may store firmware or software for controlling the semiconductor memory device 110.

The user interface 150 may include an input device interface through which a user may access the electronic device 10 and an output device interface capable of providing the user with operation states or processing results of the electronic device 10.

In an embodiment, the power supply 120 may perform a power loss protection (PLP) operation in order to cope with the sudden power loss (SPL) or the sudden power off (SPO). For example, when the SPL is detected during an operation, the power supply 120 may control the auxiliary power supply 125 to provide power to the electronic device 10. Furthermore, the central processing device 130 may perform pre-processing operation such as safe storage of data and programs for safe shut down of the electronic device 10. Then, the power supply 120 may discharge the auxiliary power supply 125 to shut down the electronic device 10.

After the SPL occurs, since the electronic device 10 operates only on the auxiliary power supply 125, it is necessary to monitor power supply capability of the auxiliary power supply 125 at certain preset periods. In the present teaching, this is defined or referred to as "health monitoring."

For health monitoring of the auxiliary power supply 125, charging of the auxiliary power supply 125 is stopped and the energy stored in the auxiliary power supply 125 is discharged. Then, power supply capability of the auxiliary power supply 125 may be evaluated based on a time required for discharging the auxiliary power supply 125 to a preset level.

Accordingly, when the SPL occurs while the auxiliary power supply 125 is being discharged for the health monitoring, the electronic device 10 may be in a very unfavorable state in terms of power supply.

Therefore, a method of applying a higher charging voltage to the auxiliary power supply 125 in order to prepare for SPL during the health monitoring may be considered.

In an embodiment, the power supply 120 may control the auxiliary power supply 125 to operate according to a charged voltage of a preset first level in a normal operation and to operate according to a charged voltage of a second level, which is higher than the first level, in a test mode in a health monitoring operation.

Figure 2:
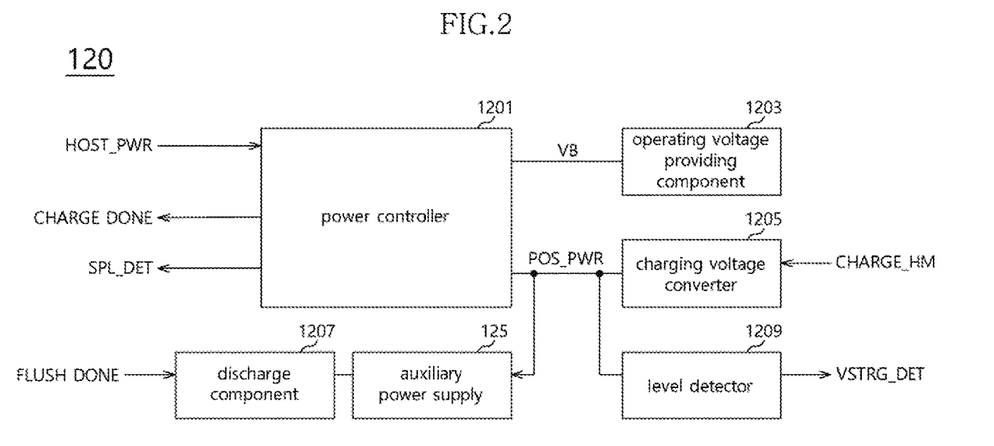
FIG. 2 is a configuration diagram of a power supply in accordance with an embodiment.

FIG. 2 is a configuration diagram of the power supply 120 in accordance with an embodiment.

Referring to FIG. 2, the power supply 120 in accordance with the embodiment may include a power controller 1201, an operating voltage providing component 1203, a charging voltage converter 1205, a discharge component 1207, a level detector 1209, and the auxiliary power supply 125.

The power controller 1201 may control a general operation of the power supply 120. In an embodiment, in a normal operation, the power controller 1201 may receive an external voltage HOST_PWR and convert the external voltage HOST_PWR to an internal voltage VB required for the electronic device 10. Furthermore, the power controller 1201 may receive the external voltage HOST_PWR and convert the external voltage HOST_PWR to a charging voltage POS_PWR required for charging the auxiliary power supply 125.

The power controller 1201 may monitor a level of the external voltage HOST_PWR, and when the level of the external voltage HOST_PWR is lower than a preset reference value, the power controller 1201 may determine that the power supply has been interrupted, for example, the SPL or the SPO has occurred, and generate a SPL detection signal SPL_DET. The SPL detection signal SPL_DET may be provided to the central processing device 130 of the electronic device 10 shown in FIG. 1.

In an embodiment, in a health monitoring mode, as the charging voltage POS_PWR supplied to the auxiliary power supply 125 increases to the preset second level and the auxiliary power supply 125 is charged to the second level, the power controller 1201 may generate a charging completion signal CHARGE DONE. The charging completion signal CHARGE DONE may be provided to the central processing device 130 of the electronic device 10 shown in FIG. 1.

As the SPL detection signal SPL_DET is enabled, the central processing device 130 may perform pre-processing operations such as safe storage data and programs for safe shut down of the electronic device 10. In an embodiment, the central processing device 130 may safely store data being in use through a so-called flushing operation for moving data stored in the buffer 1130 of the semiconductor memory device 110 to the storage 1120. The central processing device 130 may perform the pre-processing operations in the SPL state and generate a pre-processing done signal FLUSH-DONE in order for the power supply 120 to perform discharging of the auxiliary power supply 125 in response to the pre-processing done signal FLUSH-DONE for shutting down the electronic device 10. The pre-processing done signal FLUSH-DONE may be provided to the discharge component 1207.

The operating voltage providing component 1203 may receive the internal voltage VB from the power controller 1201, and generate various levels of operating voltages required for operating the electronic device 10. In an embodiment, when the storage 1120 includes a flash memory, the operating voltage providing component 1203 may convert a level of the internal voltage VB to generate various levels of voltages required for operations of program, erase, read and the like.

The charging voltage converter 1205 may be configured to increase the charging voltage POS_PWR from a first level to a second level as a health monitoring signal CHARGE_HM is enabled in the health monitoring mode. The health monitoring signal CHARGE_HM may also be called a "test mode signal".

The discharge component 1207 may be configured to discharge the auxiliary power supply 125 in response to the pre-processing done signal FLUSH-DONE provided from the central processing device 130.

The level detector 1209 may be configured to detect a voltage level of the auxiliary power supply 125 and generate a level detection signal VSTRG_DET. When the auxiliary power supply 125 is discharged to have a voltage of a preset level or less by the discharge component 1207, the level detection signal VSTRG_DET may be enabled. In order to perform the health monitoring, charging of the auxiliary power supply 125 may be stopped and the auxiliary power supply 125 may be discharged. Then, power supply capability of the auxiliary power supply 125 may be evaluated based on a time required for discharging the auxiliary power supply 125 to a preset level. To this end, when the auxiliary power supply 125 is discharged to have a voltage of a preset level, the level detector 1209 may end the health monitoring mode by enabling the level detection signal VSTRG_DET.

The auxiliary power supply 125 may include a capacitor, for example, a super capacitor.

The super capacitor is a power storage device capable of holding large capacity of electrical charge and may be used to store auxiliary power in the power supply 120. The auxiliary power supply 125 may charge electrical charge in the power-up or normal operation of the electronic device 10. The auxiliary power supply 125 of the power supply 10 may provide the electronic device 10 with auxiliary power by using charged electrical charge.

As a capacitor which may constitute the auxiliary power supply 125, an aluminum electrolytic capacitor or a polymer tantalum capacitor may be used; however, an embodiment is not limited thereto.

In general, a rated voltage of a capacitor indicates a maximum voltage which may be charged between electrodes of the capacitor. In order to safely use the capacitor, a voltage lower than the rated voltage, for example, a voltage corresponding to 80±α% of the rated voltage, may be used as the charging voltage POS_PWR of a first level to ensure reliability and safety of the capacitor. For example, when a capacitor having a rate voltage of 16V and a capacitance of 150 μF is used as a unit charge cell of the auxiliary power supply 125, the charging voltage POS_PWR of a first level (for example, 12 V) may be supplied in the normal mode. However, in the health monitoring mode, since the auxiliary power supply 125 may be required to be sufficiently charged, the charging voltage POS_PWR of a second level (for example, voltage corresponding to 90±α% of the rated voltage, for example, 14 V) may be supplied. To this end, in the health monitoring mode, as the health monitoring signal CHARGE_HM is enabled, the charging voltage POS_PWR may be increased from the first level to the second level through the charging voltage converter 1205.

Figure 3:
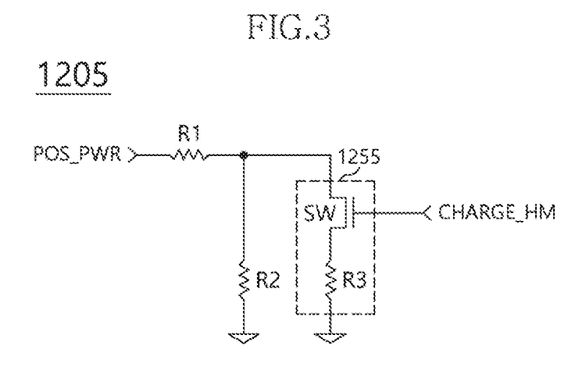
FIG. 3 is a configuration diagram of a charging voltage converter in accordance with an embodiment.

FIG. 3 is a configuration diagram of the charging voltage converter 1205 in accordance with an embodiment.

Referring to FIG. 3, the charging voltage converter 1205 in accordance with the embodiment may include a load section R1, a first voltage decision section R2, and a second voltage decision section 1255.

The first voltage decision section R2 may be configured to generate the charging voltage POS_PWR of the first level.

The second voltage decision section 1255 may be configured to generate the charging voltage POS_PWR of the second level higher than the first level.

In an embodiment, the second voltage decision section 1255 may include a switching element SW, which is electrically connected to a supply terminal of the charging voltage POS_PWR and driven in response to the health monitoring signal CHARGE_HM, and a resistance element R3 electrically connected between the switching element SW and a ground terminal. As the health monitoring signal CHARGE_HM is enabled, parallel resistance by the first voltage decision section R2 and the second voltage decision section 1255 acts on the charging voltage POS_PWR, so that the level of the charging voltage POS_PWR may be increased to the second level.

Figure 4:
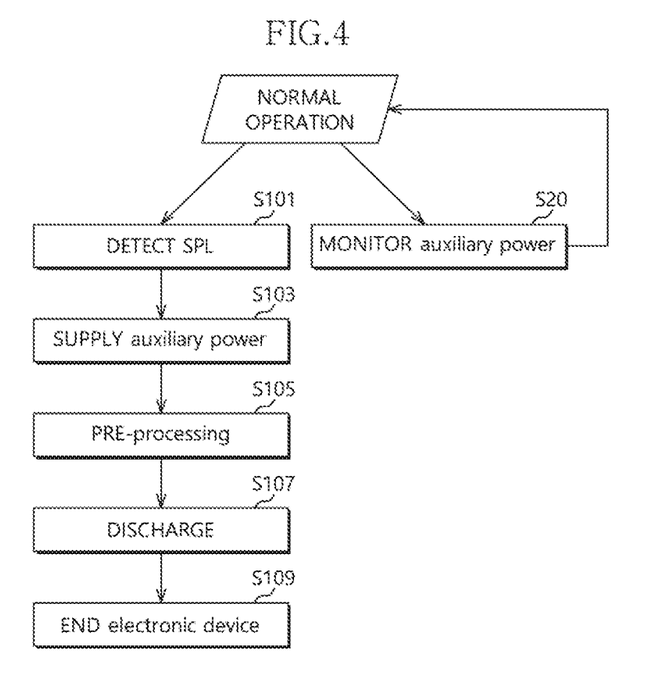
FIG. 4 is a flowchart describing a control method of an electronic device in accordance with an embodiment.
Figure 5:
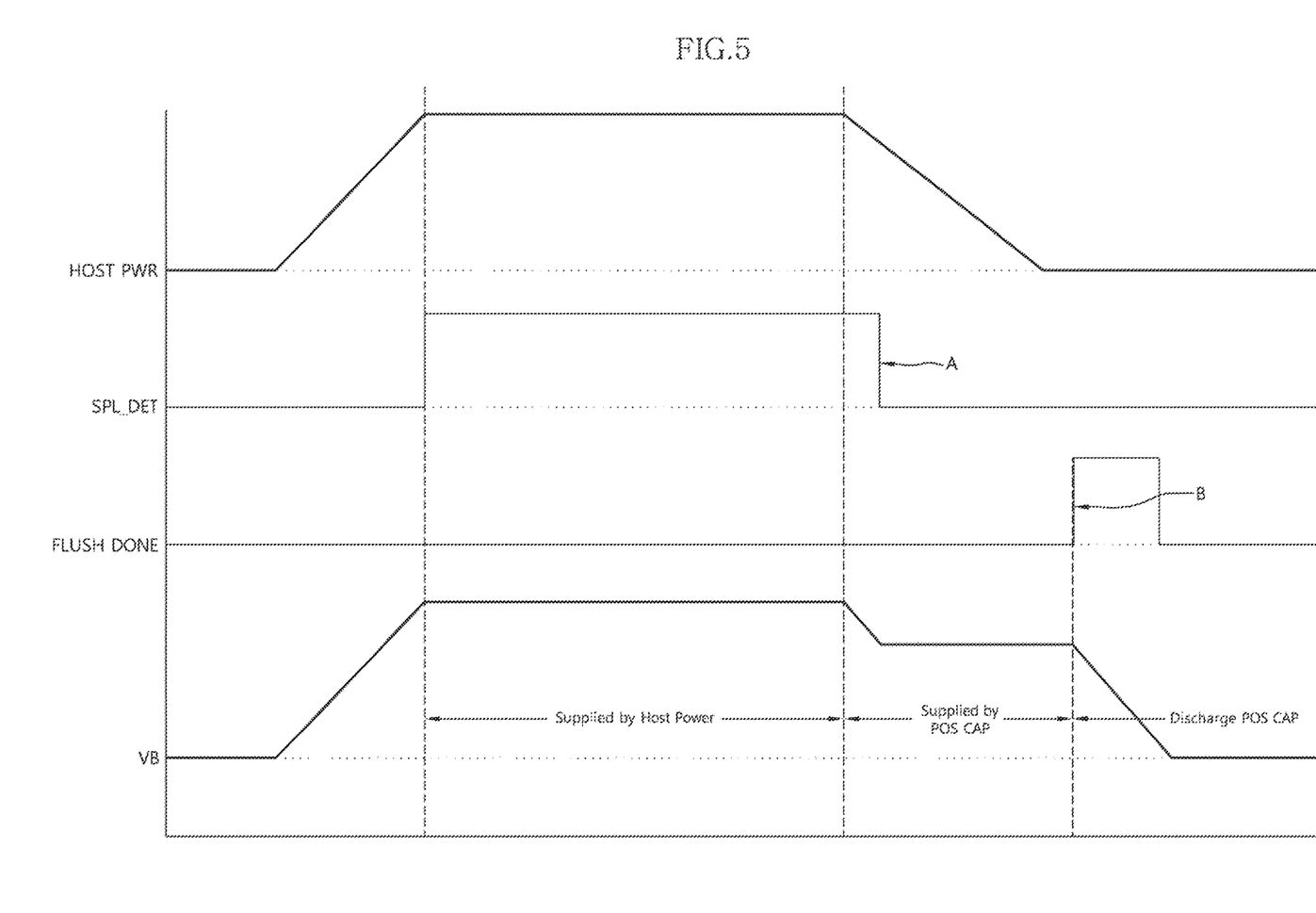
FIG. 5 is a timing diagram illustrating a control method of an electronic device in accordance with an embodiment.

FIG. 4 is a flowchart describing a control method of the electronic device 10 in accordance with an embodiment, and FIG. 5 is a timing diagram for explaining the control method of the electronic device 10 in accordance with the embodiment.

Referring to FIG. 4 and FIG. 5, during the normal operation of the electronic device 10, power may be suddenly interrupted due to failure of a power supply source itself or an electrical disconnection between the electronic device 10 and the power supply source.

During the normal operation, the power supply 120 may convert a supply voltage to the internal voltage VB.

The power controller 1201 may monitor the level of the external voltage HOST_PWR, and enable the SPL detection signal SPL_DET when the level of the supply voltage is lower than a preset reference value at step S101, as indicated by "A" in FIG. 5. The SPL detection signal SPL_DET may be provided to the central processing device 130 of the electronic device 10.

As the SPL detection signal SPL_DET is enabled, the power supply 120 operates the electronic device 10 by power charged in the auxiliary power supply 125 at step S103.

Meanwhile, as the SPL detection signal SPL_DET is enabled, the central processing device 130 may perform the pre-processing operations for safe shut down of the electronic device 10 at step S105. In an embodiment, the central processing device 130 may safely store data being in use through a so-called flushing operation for shifting data stored in the buffer 1130 of the semiconductor memory device 110 to the storage 1120. When the pre-processing operation is finished in the SPL state, the central processing device 130 may generate the pre-processing done signal FLUSH-DONE, as indicated by "B" in FIG. 5.

When the pre-processing done signal FLUSH-DONE is enabled, the discharge component 1207 of the power supply 120 may discharge the auxiliary power supply 125 at step S107. Therefore, the level of the internal voltage VB supplied to the electronic device 10 is reduced.

When the auxiliary power supply 125 is completely discharged, the electronic device 10 may be shut down at step S109. In this case, it is possible to quickly perform internal discharge in response to the pre-processing done signal FLUSH-DONE.

In an embodiment, the power supply 120 may perform a so-called health monitoring operation for monitoring the power supply capability of the auxiliary power supply 125 at certain preset periods at step S20 while the electronic device 10 is performing a predetermined operation.

Figure 6:
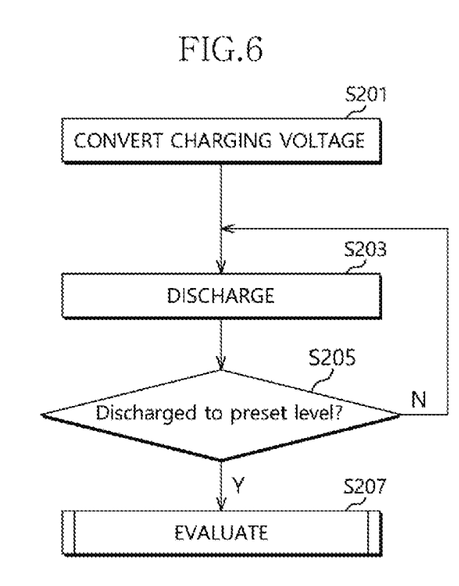
FIG. 6 is a flowchart describing a control method of an electronic device in accordance with an embodiment.

FIG. 6 is a flowchart describing a control method of the electronic device 10 in accordance with an embodiment.

Referring to FIG. 6, as the health monitoring period is reached during the normal operation, the charging voltage converter 1205 may increase the charging voltage POS_PWR from the first level to the second level in response to the health monitoring signal CHARGE_HM at step S201.

In an embodiment, when the charging voltage POS_PWR is increased to the preset second level and the auxiliary power supply 125 is charged to the second level, the charging completion signal CHARGE DONE from the power controller 1201 may be enabled. The charging completion signal CHARGE DONE may be provided to the central processing device 130 of the electronic device 10.

When the auxiliary power supply 125 is charged with the charging voltage POS_PWR to the second level and the charging completion signal CHARGE DONE is enabled, the discharge component 1207 may discharge the auxiliary power supply 125 at step S203.

When the auxiliary power supply 125 is discharged to have a voltage of a preset level at step S205 (that is "Y" at step S205), the level detection signal VSTRG_DET is enabled and the health monitoring mode is ended, so that the central processing device 130 may evaluate power supply capability based on a time required for discharging the auxiliary power supply 125 to the preset level at step S207. When the auxiliary power supply 125 is not yet discharged to have a voltage of a preset level at step S205 (that is "N" at step S205), the operation returns to step S203 in which the discharge component 1207 may discharge the auxiliary power supply 125, until the auxiliary power supply 125 is discharged to have a voltage of a preset level.

Meanwhile, the SPL may occur during the health monitoring for the auxiliary power supply 125. When the SPL occurs during such a health monitoring process, the SPL detection signal SPL_DET may be enabled. This process will be described in more detail below.

Figure 7:
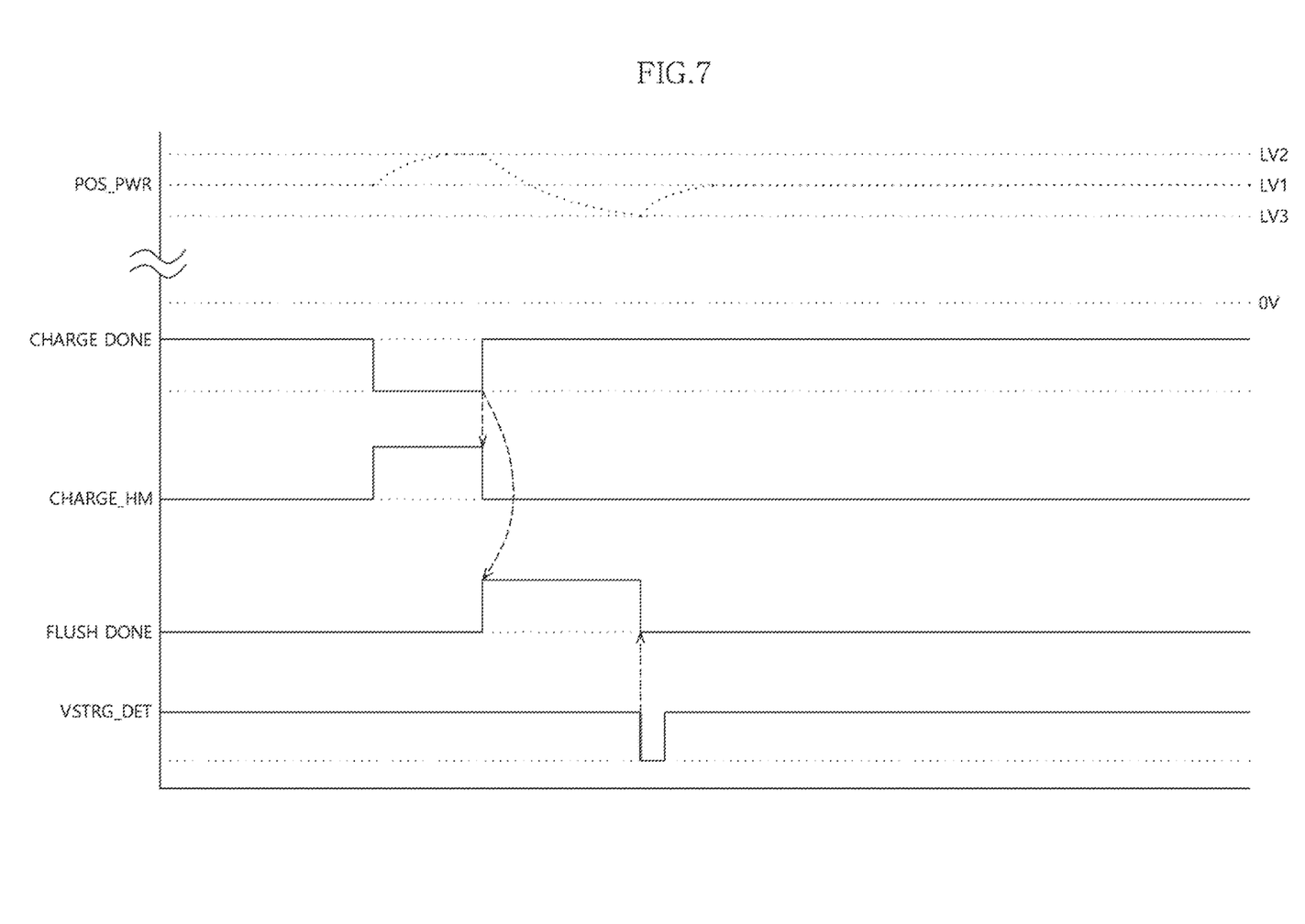
FIG. 7 is a timing diagram for explaining a control method of an electronic device in accordance with an embodiment.

FIG. 7 is a timing diagram describing the control method of the electronic device 10 in accordance with an embodiment.

In the embodiment, as the health monitoring period is reached during the normal operation, the charging voltage converter 1205 increases the charging voltage POS_PWR from a first level LV1 to a second level LV2 in response to the health monitoring signal CHARGE_HM and charges the auxiliary power supply 125.

While the auxiliary power supply 125 is being charged to the second level LV2, the charging completion signal CHARGE DONE is in a disabled state, and when the auxiliary power supply 125 is completely charged to the second level LV2 and the charging completion signal CHARGE DONE is enabled, the health monitoring signal CHARGE_HM is disabled, so that the level of the charging voltage POS_PWR for the auxiliary power supply 125 may be decreased to the first level LV1. As the health monitoring signal CHARGE_HM is disabled, the auxiliary power supply 125 begins discharging. Accordingly, the charging voltage POS_PWR drops to a preset third level LV3 via the first level LV1.

When the potential of the auxiliary power supply 125 is discharged to have a voltage of the preset third level LV3, the level detection signal VSTRG_DET is enabled and the health monitoring mode is ended, so that the central processing device 130 may evaluate power supply capability of the auxiliary power supply 125 based on a time required for discharging the auxiliary power supply 125 to the preset third level LV3.

When the SPL occurs during such a health monitoring process, the SPL detection signal SPL_DET may be enabled.

As illustrated in FIG. 7, in the state in which the charging completion signal CHARGE DONE has been enabled, that is, the auxiliary power supply 125 has been charged to have a voltage of the second level LV2, when the SPL detection signal SPL_DET is enabled, the central processing device 130 may perform the pre-processing operation for safe shut down of the electronic device 10. The pre-processing operation may include the flushing operation for shifting data of the buffer 1130 to the storage 1120. When the pre-processing operation is finished, the central processing device 130 may generate the pre-processing done signal FLUSH-DONE.

Since the auxiliary power supply 125 is charged to a voltage, which is higher than the voltage during the normal mode, in the health monitoring mode, even though the SPL occurs during the health monitoring, a sufficient time can be secured until the potential of the auxiliary power supply 125 is discharged to have a voltage of the preset third level LV3. Accordingly, it is possible to generate the pre-processing done signal FLUSH-DONE in synchronization with the enable time point of the level detection signal VSTRG_DET and to quickly perform internal discharge in response to the level detection signal VSTRG_DET.

Then, the auxiliary power supply 125 of the electronic device 10 can be completely discharged and safely shut down.

When a high voltage corresponding to 90% of the rated voltage is applied to the auxiliary power supply 125 configurable by a capacitor, it is not possible to ensure reliability of the capacitor. In the present teaching, a charging voltage higher than the voltage during the normal mode is temporarily applied only for a charge time for evaluating the power supply capability of the auxiliary power supply 125. Consequently, it is possible to safely evaluate the power supply capability while ensuring the lifespan of the capacitor, and to ensure power loss protection.

Figure 8:
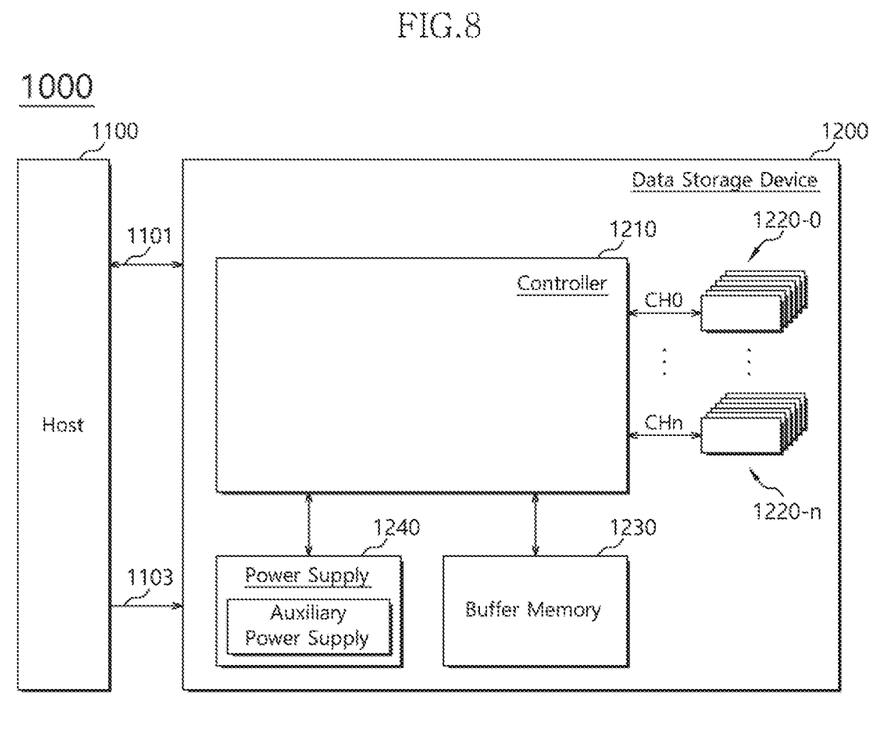
FIG. 8 is a diagram illustrating a data storage system in accordance with an embodiment.

FIG. 8 is a diagram illustrating a data storage system in accordance with an embodiment.

Referring to FIG. 8, the data storage 1000 may include a host device 1100 and the data storage device 1200. In an embodiment, the data storage device 1200 may be configured to a solid state drive (SSD).

The data storage device 1200 may include a controller 1210, a plurality of nonvolatile memory devices 1220-0 to 1220-*n*, a buffer memory device 1230, a power supply 1240, a signal connector 1101, and a power connector 1103.

The controller 1210 may control general operations of the data storage device 1200. The controller 1210 may include a host interface, a control component, a random access memory used as a working memory, an error correction code (ECC) component, and a memory interface.

The host device 1100 may exchange a signal with the data storage device 1200 through the signal connector 1101. The signal may include a command, an address, data, and so forth.

The controller 1210 may analyze and process the signal received from the host device 1100. The controller 1210 may control operations of internal function blocks according to a firmware or a software for driving the data storage device 1200.

The buffer memory device 1230 may temporarily store data to be stored in at least one of the nonvolatile memory devices 1220-0 to 1220-*n*. Further, the buffer memory device 1230 may temporarily store the data read from at least one of the nonvolatile memory devices 1220-0 to 1220-*n*. The data temporarily stored in the buffer memory device 1230 may be transmitted to the host device 1100 or at least one of the nonvolatile memory devices 1220-0 to 1220-*n* according to control of the controller 1210.

The nonvolatile memory devices 1220-0 to 1220-*n* may be used as storage media of the data storage device 1200. The nonvolatile memory devices 1220-0 to 1220-*n* may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103, to the inside of the data storage device 1200. The power supply 1240 may include an auxiliary power supply. The auxiliary power supply may supply power to allow the data storage device 1200 to be normally terminated when a sudden power-off occurs. The auxiliary power supply may include large capacity capacitors. In an embodiment, the power supply 1240 may configured as shown is FIG. 2 and FIG. 3.

The signal connector 1101 may be configured by various types of connectors depending on an interface scheme between the host device 1100 and the data storage device 1200.

The power connector 1103 may be configured by various types of connectors depending on a power supply scheme of the host device 1100.

Figure 9:
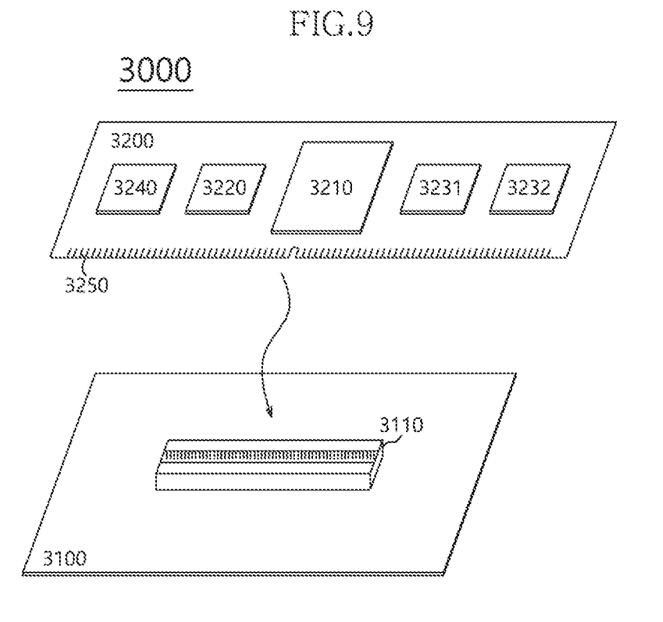
FIG. 9 and FIG. 10 are diagrams illustrating a data processing system in accordance with an embodiment.

FIG. 9 is a diagram illustrating a data processing system in accordance with an embodiment. Referring to FIG. 9, the data processing system 3000 may include a host device 3100 and the memory system 3200.

The host device 3100 may be configured in the form of a board such as a printed circuit board. Although not shown, the host device 3100 may include internal function blocks for performing the function of a host device.

The host device 3100 may include a connection terminal 3110 such as a socket, a slot or a connector. The memory system 3200 may be mounted to the connection terminal 3110.

The memory system 3200 may be configured in the form of a board such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. In and embodiment, the PMIC 3240 may be configured in the same manner as the power supply as shown in FIGS. 2 and 3.

The buffer memory device 3220 may temporarily store data to be stored in the nonvolatile memory devices 3231 and 3232. Further, the buffer memory device 3220 may temporarily store the data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250, to the inside of the memory system 3200. The PMIC 3240 may manage the power of the memory system 3200 according to control of the controller 3210. In an embodiment, the PMIC 3240 may be configured by the power supply as shown in FIGS. 2 and 3.

The connection terminal 3250 may be coupled to the connection terminal 3110 of the host device 3100. Through the connection terminal 3250, signals such as commands, addresses, data and so forth and power may be transferred between the host device 3100 and the memory system 3200. The connection terminal 3250 may be configured into various types depending on an interface scheme between the host device 3100 and the memory system 3200. The connection terminal 3250 may be disposed on any one side of the memory system 3200.

Figure 10:
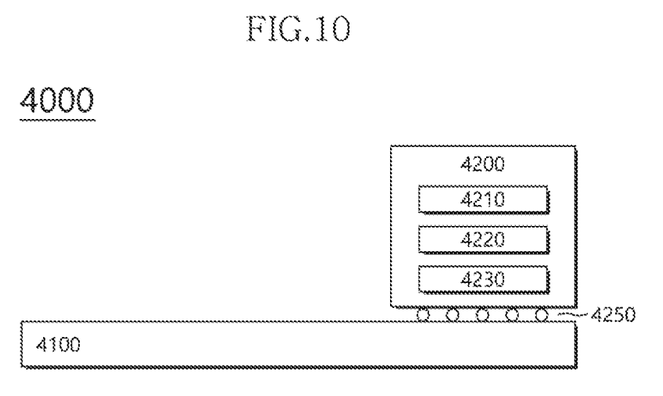

FIG. 10 is a diagrams illustrating a data processing system in accordance with an embodiment. Referring to FIG. 10, the data processing system 4000 may include a host device 4100 and the memory system 4200.

The host device 4100 may be configured in the form of a board such as a printed circuit board. Although not shown, the host device 4100 may include internal function blocks for performing the function of a host device.

The memory system 4200 may be configured in the form of a surface-mounting type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200.

The buffer memory device 4220 may temporarily store data to be stored in the nonvolatile memory device 4230. Further, the buffer memory device 4220 may temporarily store the data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

The memory system 4200 may be configured to provide power from the host device 4100. In an embodiment, the host device may be comprised the power supply as shown in FIGS. 2 and 3.

Figure 11:
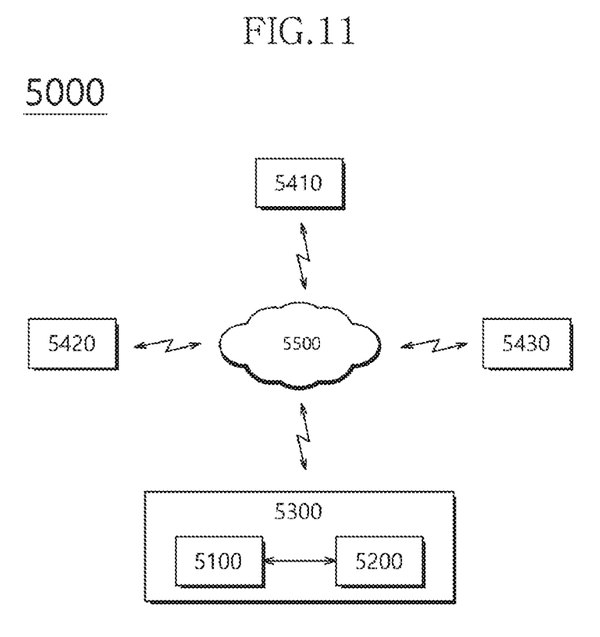
FIG. 11 is a diagram illustrating a network system including a data storage device in accordance with an embodiment.

FIG. 11 is a diagram illustrating a network system including a data storage device in accordance with an embodiment. Referring to FIG. 11, the network system 5000 may include a server system 5300 and a plurality of client systems 5410 to 5430 which are coupled through a network 5500.

The server system 5300 may service data in response to requests from the plurality of client systems 5410 to 5430. For example, the server system 5300 may store the data provided from the plurality of client systems 5410 to 5430. For another example, the server system 5300 may provide data to the plurality of client systems 5410 to 5430.

The server system 5300 may include a host device 5100 and the memory system 5200. The memory system 5200 may be configured by the memory system 10 shown in FIG. 1, the data storage device 1200 shown in FIG. 8, the memory system 3200 shown in FIG. 9 or the memory system 4200 shown in FIG. 10.

Figure 12:
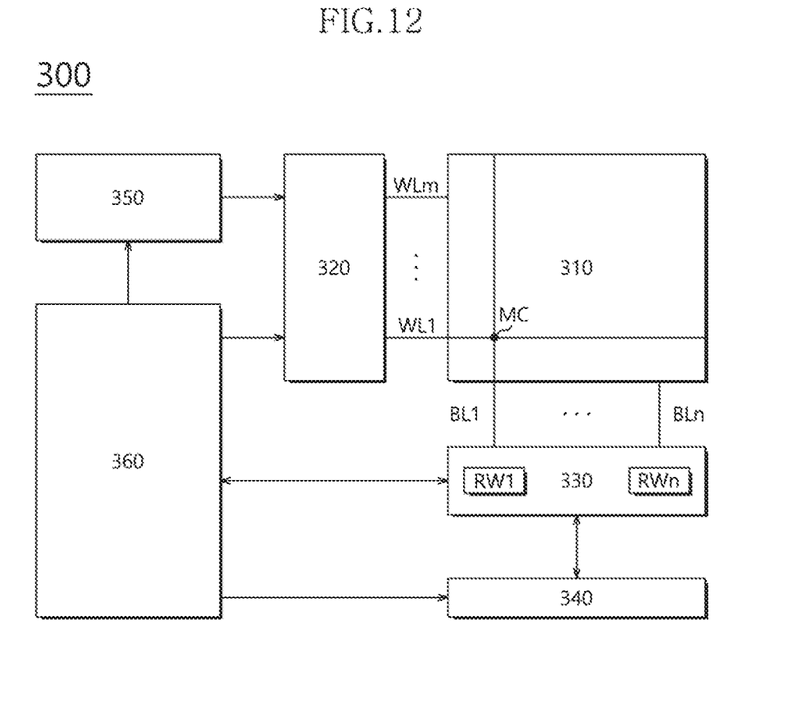
FIG. 12 is a block diagram illustrating a nonvolatile memory device included in a data storage device in accordance with an embodiment.

FIG. 12 is a block diagram illustrating a nonvolatile memory device included in a data storage device in accordance with an embodiment. Referring to FIG. 12, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array has a direction perpendicular to the flat surface of a semiconductor substrate. Moreover, the three-dimensional memory array means a structure including NAND strings which at least memory cell is located in a vertical upper portion of the other memory cell.

The structure of the three-dimensional memory array is not limited thereto. It is apparent that the memory array structure can be selectively applied to a memory array structure formed in a highly integrated manner with horizontal directionality as well as vertical directionality.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the data storage device, the operating method thereof and the storage system including the same described herein should not be limited based on the described embodiments.

What is claimed is:

1. An electronic device comprising:
   a semiconductor memory device;
   a central processing device configured to control an operation of the semiconductor memory device; and
   a power supply configured to supply power to the semiconductor memory device and the central processing device,
   wherein the power supply comprises:
   a power controller configured to receive external power and generate an internal voltage and a charging voltage;
   an auxiliary power supply configured to be charged by the charging voltage in a normal mode and to provide charged power when a sudden power loss (SPL) or a sudden power off (SPO) occurs; and
   a charging voltage converter configured to supply the auxiliary power supply with the charging voltage of a first level in the normal mode, and to increase the charging voltage to a second level that is higher than the first level and supply the charging voltage to the auxiliary power supply in a test mode.

2. The electronic device according to claim 1, wherein the charging voltage converter comprises:
   a first voltage decision section configured to generate the charging voltage of the first level; and
   a second voltage decision section configured to generate the charging voltage of the second level.

3. The electronic device according to claim 2, wherein the second voltage decision section comprises:
   a switching element configured to be electrically connected to a supply terminal of the charging voltage and driven in response to a test mode enable signal; and
   a resistance element configured to be electrically connected between the switching element and a ground terminal.

4. The electronic device according to claim 1, wherein the auxiliary power supply includes a plurality of capacitors and the first level corresponds to 80±α% of a rated voltage of the capacitor.

5. The electronic device according to claim 1, wherein the auxiliary power supply includes a plurality of capacitors and the second level corresponds to 90±α% of a rated voltage of the capacitor.

6. A power supply for an electronic device, comprising:
   a power controller configured to receive external power and generate an internal voltage and a charging voltage;
   an auxiliary power supply configured to be charged by the charging voltage in a normal mode and to provide charged power when a sudden power loss (SPL) or a sudden power off (SPO) occurs; and
   a charging voltage converter configured to supply the auxiliary power supply with the charging voltage of a first level in the normal mode, and to increase the charging voltage to a second level that is higher than the first level and supply the charging voltage to the auxiliary power supply in a test mode.

7. The power supply for the electronic device according to claim 6, wherein the charging voltage converter comprises:
   a first voltage decision section configured to generate the charging voltage of the first level; and
   a second voltage decision section configured to generate the charging voltage of the second level.

8. The power supply for the electronic device according to claim 7, wherein the second voltage decision section comprises:
   a switching element configured to be electrically connected to a supply terminal of the charging voltage and driven in response to a test mode enable signal; and
   a resistance element configured to be electrically connected between the switching element and a ground terminal.

9. The power supply for the electronic device according to claim 6, wherein the auxiliary power supply includes a plurality of capacitors and the first level corresponds to 80±α% of a rated voltage of the capacitor.

10. The power supply for the electronic device according to claim 6, wherein the auxiliary power supply includes a plurality of capacitors and the second level corresponds to 90±α% of a rated voltage of the capacitor.

11. A control method of a power supply for an electronic device, which includes an auxiliary power supply that receives external power, supplies the external power to the electronic device, is charged by a charging voltage in a normal mode, and provides charged power when a sudden power loss (SPL) or a sudden power off (SPO) occurs, the control method comprising:
    supplying the charging voltage of a first level to the auxiliary power supply in the normal mode; and
    increasing the charging voltage to a second level that is higher than the first level and supplying the charging voltage to the auxiliary power supply in a test mode.

12. The control method of the power supply for the electronic device according to claim 11, further comprising:
    discharging the auxiliary power supply after the auxiliary power supply is charged to the second level; and
    evaluating the auxiliary power supply based on a time required for discharging the auxiliary power supply to a preset third level as the auxiliary power supply is discharged to have a voltage of the preset third level.

13. The control method of the power supply for the electronic device according to claim 11, wherein the auxiliary power supply includes a plurality of capacitors and the first level corresponds to 80±α% of a rated voltage of the capacitor.

14. The control method of the power supply for the electronic device according to claim 11, wherein the auxiliary power supply includes a plurality of capacitors and the second level corresponds to 90±α% of a rated voltage of the capacitor.

* * * * *